(12) United States Patent
Lin (10) Patent No.: US 8,107,311 B2
(45) Date of Patent: *Jan. 31, 2012

(54) SOFTWARE PROGRAMMABLE MULTIPLE FUNCTION INTEGRATED CIRCUIT MODULE

(75) Inventor: Mou-Shiung Lin, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/034,668

(22) Filed: Feb. 21, 2008

(65) Prior Publication Data

US 2008/0143387 A1    Jun. 19, 2008

Related U.S. Application Data

(60) Continuation of application No. 10/385,953, filed on Mar. 11, 2003, now Pat. No. 7,360,005, which is a division of application No. 09/422,174, filed on Oct. 22, 1999, now Pat. No. 6,555,398.

(51) Int. Cl.
| | |
|---|---|
| G06F 17/50 | (2006.01) |
| G06F 9/455 | (2006.01) |
| G06F 11/22 | (2006.01) |
| G06F 13/00 | (2006.01) |
| G06F 13/28 | (2006.01) |
| G11C 8/00 | (2006.01) |
| H03K 19/173 | (2006.01) |

(52) U.S. Cl. ............ 365/230.06; 326/37; 711/105; 716/132; 716/133; 716/136; 716/137; 716/138

(58) Field of Classification Search .......... 716/16–17, 716/100, 132–134, 136–138; 326/37; 365/230.01–230.03, 230.06; 711/105

See application file for complete search history.

(56) References Cited

U.S. PATENT DOCUMENTS 3,693,029 A    9/1972 Niven, Jr.
(Continued)

FOREIGN PATENT DOCUMENTS

TW    440995    6/2001
(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Stacy Whitmore
(74) *Attorney, Agent, or Firm* — McDermott Will & Emery LLP (57) ABSTRACT

An electrically programmable multiple selectable function integrated circuit module has a plurality of optionally selectable function circuits, which receive and manipulate a plurality of input data signals. The outputs of the plurality of optionally selectable function circuits are either interconnected to each other or connected to a plurality of output connectors to transmit manipulated output data signals to external circuitry. The electrically programmable multiple selectable function integrated circuit module has at least one configuration connector, which may be multiplexed with input control and timing signals, connected to a function configuration circuit to receive electrical configuration signals indicating the activation of a program mode and which of the optionally selectable function circuits are to be elected to manipulate the input data signals. The function configuration circuit is connected to the optionally selectable function circuits to selectively elect, which of the optionally selectable function circuits are to is manipulate the input data signals. The electrically programmable multiple selectable function integrated circuit module optionally has common function circuit connected to common function connectors and the plurality of optionally selectable function circuits to manipulate common data signals, and transmit common output data signals to the selectable function circuits.

20 Claims, 8 Drawing Sheets

U.S. PATENT DOCUMENTS

| | | | |
|---|---|---|---|
| 5,140,688 A | | 8/1992 | White |
| 5,360,992 A | * | 11/1994 | Lowrey et al. ............... 257/666 |
| 5,379,442 A | | 1/1995 | Allen |
| 5,467,304 A | | 11/1995 | Uchida et al. |
| 5,511,182 A | | 4/1996 | Le et al. |
| 5,536,667 A | * | 7/1996 | Cho .............................. 438/591 |
| 5,536,677 A | * | 7/1996 | Hubacher ..................... 438/613 |
| 5,554,940 A | * | 9/1996 | Hubacher ..................... 324/765 |
| 5,642,304 A | | 6/1997 | Simpson |
| 5,650,967 A | | 7/1997 | Seibert |
| 5,740,069 A | | 4/1998 | Agrawal |
| 5,761,145 A | | 6/1998 | Zagar et al. |
| 5,762,259 A | * | 6/1998 | Hubacher et al. ........ 228/180.22 |
| 5,838,165 A | | 11/1998 | Chatter |
| 5,841,957 A | | 11/1998 | Ju et al. |
| 5,893,927 A | * | 4/1999 | Hovis ........................... 711/171 |
| 5,970,008 A | | 10/1999 | Zagar et al. |
| 5,987,560 A | | 11/1999 | Gulick |
| 6,049,856 A | | 4/2000 | Bolyn |
| 6,052,773 A | | 4/2000 | DeHon et al. |
| 6,070,262 A | | 5/2000 | Kellogg |
| 6,097,647 A | | 8/2000 | Zagar et al. |
| 6,180,426 B1 | | 1/2001 | Lin |
| 6,255,847 B1 | | 7/2001 | Chan et al. |
| 6,277,669 B1 | * | 8/2001 | Kung et al. ................... 438/106 |
| 6,356,958 B1 | | 3/2002 | Lin |
| 6,586,266 B1 | | 7/2003 | Lin |
| 6,939,747 B1 | | 9/2005 | Lin |
| 7,848,153 B2 | * | 12/2010 | Bruennert et al. ........ 365/185.25 |
| 7,869,275 B2 | * | 1/2011 | Grant et al. .............. 365/185.08 |
| 2008/0084743 A1 | * | 4/2008 | Grant et al. .............. 365/185.08 |
| 2010/0046325 A1 | * | 2/2010 | Bruennert et al. .............. 365/51 |

FOREIGN PATENT DOCUMENTS

| | | |
|---|---|---|
| TW | 448619 | 8/2001 |
| TW | 451142 | 8/2001 |
| TW | 481918 | 4/2002 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects On Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Canference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

SOFTWARE PROGRAMMABLE MULTIPLE FUNCTION INTEGRATED CIRCUIT MODULE

This application is a continuation of application Ser. No. 10/385,953, filed on Mar. 11, 2003, now U.S. Pat. No. 7,360,005, which is a division of application Ser. No. 09/422,174, filed on Oct. 22, 1999, now U.S. Pat. No. 6,555,398.

BACKGROUND OF THE INVENTION

1. Field of the Invention

This invention is related to integrated circuits formed on a semiconductor substrate. More particularly, this invention is related to integrated circuits having multiple selectable functions. These functions are selectable during operation by "software" programming.

2. Description of the Related Art

The structures of a field programmable gate array (FPGA) and programmed logic devices (PLD) are well known in the art. An FPGA and PLD each have configurable logic blocks (CLB) that will perform a Boolean logic operation on a group of input signals to perform a single complex logical function. The configurable logic blocks are then interconnected to form even more complex logic structures. The interconnection between the configurable logic blocks may be created by physically destroying fuses to break undesired connections or by activating pass transistors between wiring segments routed on the semiconductor substrate.

U.S. Pat. No. 5,740,069 (Agrawal et al.) describes a programmable integrated circuit that includes configurable logic blocks (CLB's), configurable input/output blocks (IOB's) and an interconnect network for providing program-defined routing of signals between the CLB's and IOB's. The interconnect network includes direct connect means for providing programmably-selectable, dedicated connections between a first CLB and one or more adjacent CLB's and further between a first CLB and one or more CLB's. The interconnect network also includes peripheral direct connect means for providing programmably selectable, dedicated connections between a first configurable IOB and first and second CLB's.

U.S. patent application Ser. No. 09/246,303, filed Feb. 8, 1999, teaches an integrated circuit module that has a common function known good integrated circuit die with selectable functions. The selectable functions are selected during assembly of the known good integrated circuit die. The known good integrated circuit die is mounted to a second level substrate. The second level substrate has wiring connections to the input/output pads of the known good integrated circuit die that select desired input functions and output functions.

Further, the wiring connections on the second level substrate provide signal paths to transfer signals to the desired input function and signals from the desired output function, and signals to and from the common functions. In addition, the wiring connections form connections between the input/output pads and external circuitry. To select the desired input functions and the desired output functions, appropriate logic states are applied to input/output pads connected to a function selector to configure a functional operation of the integrated circuit module. The second level module substrate has connector pins to provide physical and electrical connections between the external circuitry and the wiring connections on the second level substrate.

U.S. Pat. No. 5,360,992 (Lowery et al.) illustrates a semiconductor package which allows pinouts and bond options to be customized after encasement of a semiconductor die. The semiconductor package has two assemblies in a first embodiment and an optional third assembly in a second embodiment.

As semiconductor processing technology has improved, the number of electronic components has increased until it is now possible to incorporate multiple complete functions on an integrated circuit die. The concept of being able to have multiple selectable functions incorporated on a single integrated circuit die is known in the art. U.S. Pat. No. 5,511,182 (Le et al.) teaches a pin configuration logic circuit. The pin configuration logic circuit has a pin function register which defines a selected pin function, such as chip enable, write enable, and output enable to be provided as a chip select signal. The logic circuit allows an arbitrary pipeline length by causing the chip select signal to obey only the timing of the active cycle. For a two-deep access pipeline the logic circuit marks whether a first or a second cycle owns the pin. The pin configuration logic circuit uses the timing associated with the selected pin function to provide the chip select signal during the first cycle if the attributes of the cycle, such as an access to a region programmed in the pin function register, are met. During the second cycle, the pin configuration logic circuit further obeys the timing associated with the selected pin function if the attributes of that cycle are also met.

Further, the concept of reconfigurable circuit functions has been explored in the art. "Towards the Realistic Virtual Hardware", Shibata et al., Innovative Architecture for Future Generation High-Performance Processors and Systems, October 1997, pp. 50-55 describes a virtual hardware system that executes dataflow algorithms. It is based on an MPLD (Multifunction Programming Logic Device), an extended FPGA (Field Programmable Gate Array) that implements multiple sets of functions as configurations of a single chip. An algorithm to be executed on the virtual hardware is written in the DFC dataflow language and then translated into a collection of FPGA configurations, each representing a page-sized sub graph of the dataflow graph. Although an emulation system and software environment for the virtual hardware has been developed it has tended to be an unrealistic system due to the difficulty of the MPLD implementation. However, with recent technologies of semiconductors, FPGA and DRAM can be implemented into a single LSI chip. By using the common buffer of the DRAM array as a configuration memory of an FPGA, replacement of configuration data can be done at almost the same speed as an MPU. Compared with the MPLD approach, a large amount of data can be stored in the integrated DRAM.

While Shibata, et al. describes a configurable digital logic system, mixed signal (analog and digital) applications can be designed for reconfiguration. "Reconfigurable Signal Processing ASIC Architecture For High Speed Data Communications", Grayver, et al., Proceedings of the 1998 IEEE International Symposium on Circuits and Systems, June 1998, ISCAS '98, Vol. 4, pp. 389-392 illustrates a flexible and reconfigurable signal processing ASIC architecture. The proposed architecture can be used to realize any one of several functional blocks needed for the physical layer implementation of high speed data communication systems operating at symbol rates over 60M samples/sec. In fact, multiple instances of a chip based on this architecture, each operating in a different mode, can be used to realize the entire physical layer of high-speed data communication systems. The architecture features the following modes (functions); real and complex FIR/IIR filtering, least mean square (LMS) based adaptive filtering, Discrete Fourier Transforms (DFT) and direct digital frequency synthesis (DDFS), at up to 60M samples/sec. All of the modes are mapped onto a common, regular datapath with minimal configuration logic and routing. Multiple chips operating in the same mode can be cascaded to allow for larger blocks.

This invention is related to the U.S. patent application Ser. No. 09/258,911, filing date Mar. 1, 1999, now U.S. Pat. No. 6,180,426 B1, issued Jan. 30, 2001.

This invention is related to the U.S. patent application Ser. No. 09/729,152, filing date Dec. 4, 2000, now U.S. Pat. No. 6,303,996 B1, issued Oct. 16, 2001.

This invention is related to the U.S. patent application Ser. No. 09/849,039, filing date May 4, 2000, now U.S. Pat. No. 6,585,266 B1, issued Jul. 1, 2003.

This invention is related to the U.S. patent application Ser. No. 10/420,596, filing date Apr. 22, 2003.

This invention is related to the U.S. patent application Ser. No. 09/246,303, filing date Feb. 8, 1999, now U.S. Pat. No. 6,356,958 B1, issued Mar. 12, 2002.

This invention is related to the U.S. patent application Ser. No. 09/961,767, filing date Sep. 21, 2001.

SUMMARY OF THE INVENTION

An object of this invention is to provide an integrated circuit having multiple selectable functions that can be chosen by electrical signals controlled by software programming.

Another object of this invention is to provide a circuit to allow ease of programming of selected functions of the multiple selectable function on an integrated circuit chip.

To accomplish these and other functions, an electrically programmable multiple selectable function integrated circuit module has a plurality of input connectors to receive a plurality of input data signals. The plurality of input data signals transferred through the plurality of input connectors to a plurality of optionally selectable function circuits. The outputs of the plurality of optionally selectable function circuits are either interconnected to each other or connected to a plurality of output connectors to transmit manipulated output data signals to external circuitry.

The electrically programmable multiple selectable function integrated circuit module has at least one configuration connector connected to a function configuration circuit to receive electrical configuration signals indicating which of the optionally selectable function circuits are to be elected to manipulate the input data signals. The function configuration circuit is connected to the optionally selectable function circuits to selectively elect which of the optionally selectable function circuits are to manipulate the input data signals;

The electrically programmable multiple selectable function integrated circuit module optionally has a plurality of common function connectors to receive common input data signals and transmit common output data signals. The common function circuit is connected to the common function connectors and the plurality of optionally selectable function circuits to manipulate the common data signals, and transmit the common output data signals to the selectable function circuits.

The electrically programmable multiple selectable function integrated circuit module has the plurality of optionally selectable function circuits, the function configuration circuit, and the common function circuit fabricated on at least one semiconductor substrate. The semiconductor substrate has input/output connectors formed from a ball-grid array. The input/output connectors are the input connectors, the output connectors, the function configuration connectors, and the common function connectors.

The electrical configuration signal sets the electrically programmable multiple selectable function integrated circuit module to a program state, whereby the input data signals convey a programmed configuration to select the desired optionally selectable function circuits. The configuration circuit includes a function selector placed between the input connectors and the optionally selectable function circuits and between the optionally selectable function circuits and the output connectors to select which of the optionally selectable function circuits are to manipulate the input data signals and which of the optionally selectable function circuits are to transmit the manipulated output data signals. The configuration circuit also includes a function programming circuit to receive, interpret, and retain the input data signals containing the data to identify those optionally selectable function circuits to be selected. The configuration circuit further has a mode selector to transfer the integrated circuit module from an operational state to a program state that disconnects the input connectors from the optionally selectable function circuits and connects the input connectors to the function programming circuit such that the input data signal is interpreted to identify those optionally selectable function circuits that are to manipulate the input data signal during the operational state.

The function programming circuit has a plurality of latch circuits. Each latch circuit has an input to receive the input data signal, a memory element to retain the data to identify the optionally selectable function circuits, and an output to transmit the identity of those optionally selectable function circuits that are elected to manipulate the input data.

The mode selector is comprised of a plurality of switching circuits. Each switching circuit has an input terminal connected to one of the input connectors, a first output terminal connected to the optionally selectable function circuits through the mode selection circuit, a second output terminal connected to the function programming circuit, and a control terminal connected to the configuration connector to receive the electrical configuration signal. The second output terminal transfers the identity of those optionally selectable function circuits to the function programming circuit. The control terminal changes the integrated circuit module between the operational state to the program state.

BRIEF DESCRIPTION OF THE DRAWINGS

FIG. 2, composed of FIGS. 2a and 2b, is a schematic diagram of a second embodiment of an electrically programmable multiple selectable function integrated circuit module of this invention.

FIG. 5, composed of FIGS. 5a and 5b, is a schematic diagram of a DRAM of this invention having multiple electrically programmable input/output configurations and illustrating a function programming circuit of this invention.

DETAILED DESCRIPTION OF THE INVENTION

Figure 1:
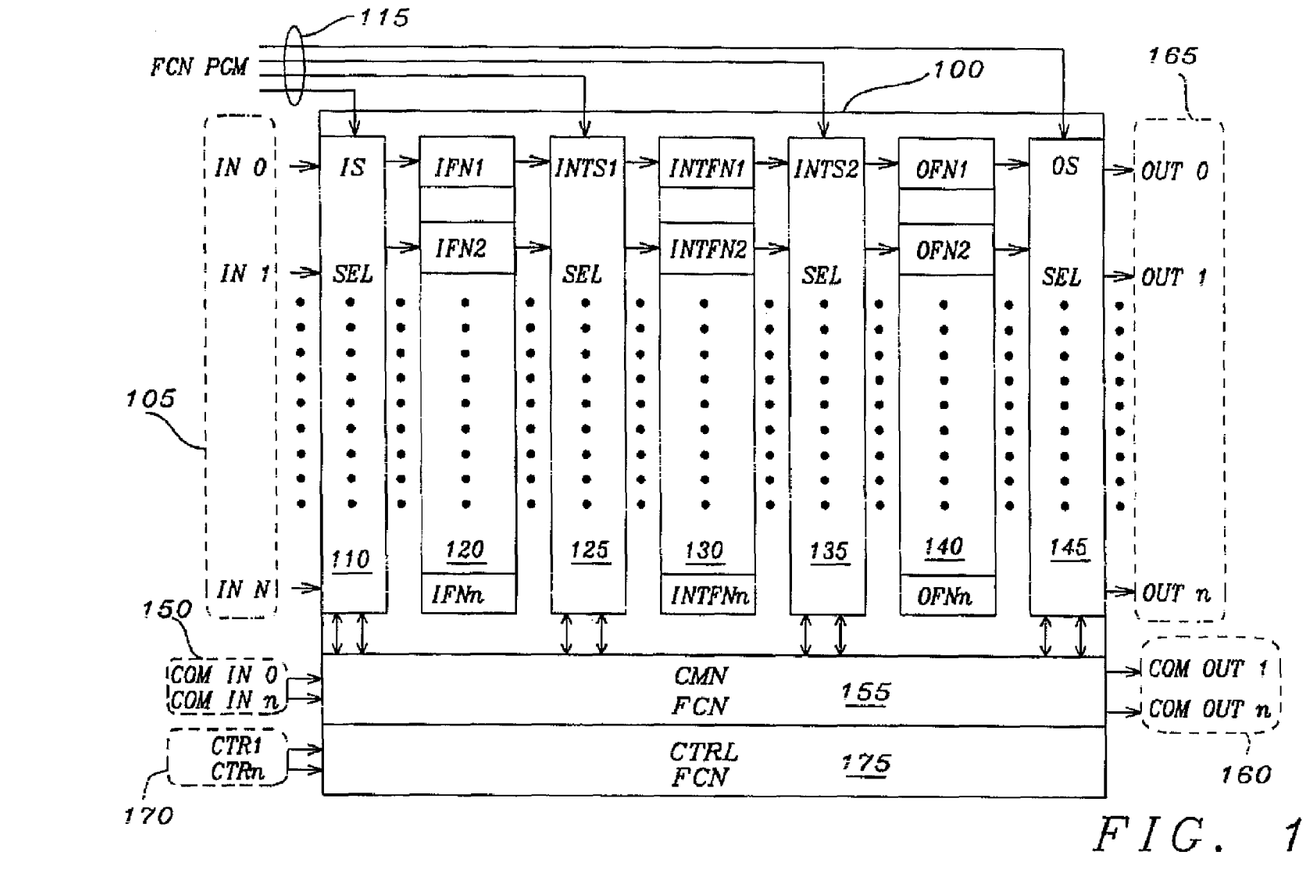
FIG. 1 is a schematic diagram of an electrically programmable multiple selectable function integrated circuit module of this invention.

Refer to FIG. 1 for a discussion of the generalized structure of the electrically programmable multiple selectable function integrated circuit module 100 of this invention. A set of input connectors 105 provide a path for input signals to be applied to the electrically programmable multiple selectable function integrated circuit module 100. The input signals are either digital signals containing digital data or analog signals to be processed.

The input signals are received by the input selector 100 and routed to the input function circuits 120. The routing of the input signals to the input function circuits 120 are determined by the function selection signals presented to the configuration connectors 115. The input function circuits 120 perform such functions as address decode for a memory, data validity checks for data integrity, data normalization for complex computation, or analog-to-digital conversion for mixed signal applications. It is apparent to those skilled in the art that the listing of the functions performed by the input function circuit 120 is incomplete and other input functions that are performed are in keeping with this invention.

The output signals of the input function circuit 120 are the inputs of the first internal function selector 125. The output signals of the input function circuit 120 are routed to the internal function circuits 130 by the function selection signals presented to the configuration connectors 115. The internal function circuit 130 manipulate the output signals of the input function circuits and create their own output signals that are presented to the second internal function selector 135. The internal function circuits 130 perform such functions as storage, retention, and retrieval of data as in a memory, complex calculations such as those used in digital signal processors, or any arithmetic or logical functions performed by a computational processor. It will, again, be apparent to those skilled in the art that the aforementioned listing of the functions of internal function circuits 130 is not complete and other internal functions that are performed are in keeping with this invention.

The output signals of the internal function circuits 130 are routed in the second internal function selector 135 to output function circuits 140 by the function selection signals presented to the configuration connectors 115. The output function circuits 140 perform such functions as signal level conversion, buffering, and driving transmission lines; creation of redundant data codes for preservation of data signal integrity; or digital-to-analog conversion of the output signals. Once more, it will be apparent to those skilled in the art that the listing of the output functions is incomplete and that other output functions may be performed and still be in keeping with this invention.

The output signals of the output function are routed to the output connectors 165 by the output function selector 145. The routing of the output signals of the output functions 140 are determined by the function selection signals presented to the configuration connectors 115. The output signals of the output function 140 are then transmitted to external circuitry for further processing.

The electrically programmable multiple selectable function integrated circuit module 100 may optionally have common functions 155 that are standard and not reconfigured for each application. The common function 155 has common input signals presented through the common input connectors 150. The common input signals are such signals data signals that are common to all configurations of the electrically programmable multiple selectable function integrated circuit module 100. The common functions 155 create a set of common output signals that are presented to external circuitry through the common output connections. The common output signals are such signals as diagnostic data signals indicating the level of functioning of the electrically programmable multiple selectable function integrated circuit module 100. Additionally, the common output signals may be the output data that complies with certain communication standards that will be implemented by all possible configurations of the electrically programmable multiple selectable function integrated circuit module 100.

The common function 155 additionally has outputs that will transfer common internal data signals between the input selector 110, the first and second internal selectors 125 and 135 and the output selectors 145. The routing of common internal data signals is controlled by the function selection signals through the configuration connectors 115.

The electrically programmable multiple selectable function integrated circuit also optionally may have a control and timing function 175 to receive a set of external control and timing signals 170. The external control and timing signals 170 for example are clocking, reset, chip select, or other initiation signals.

Figure 2A:
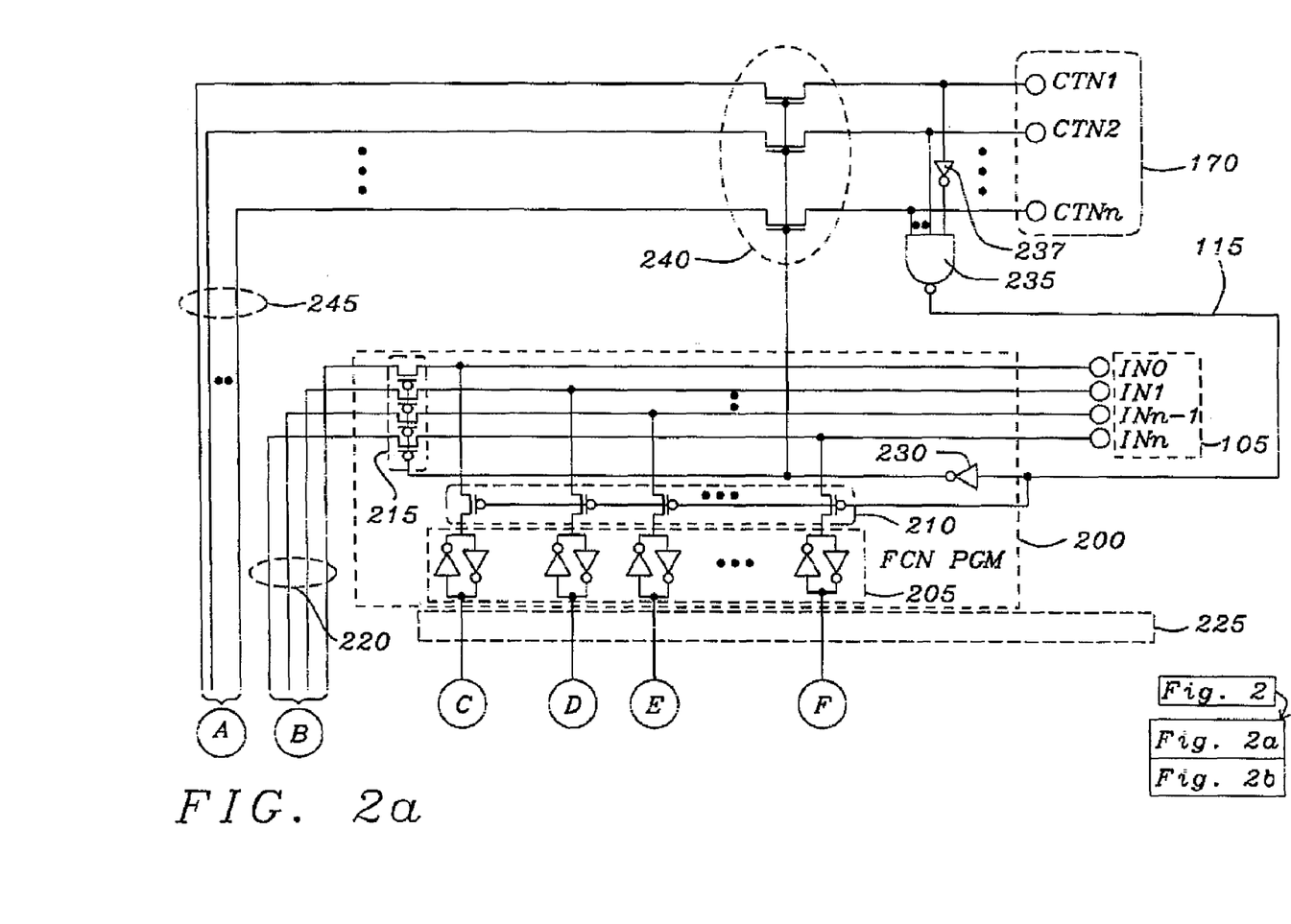
Figure 2B:
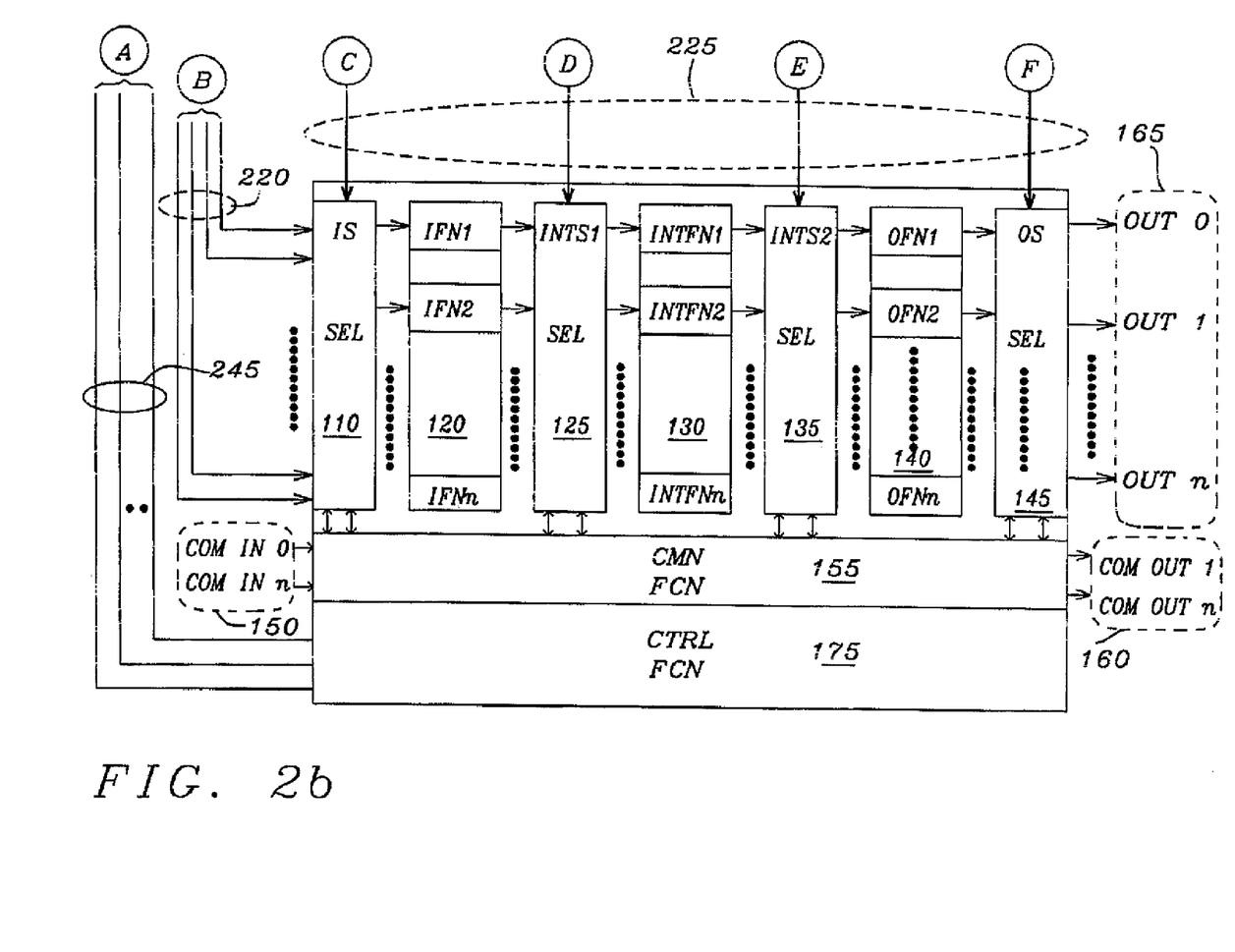

It is common in the design of integrated circuit structures to multiplex the functions of input/output connectors. It would therefore be in keeping with the intent of this invention for the input signals and the output signals to be transferred through a common set of input/output connectors. FIG. 2 illustrates a further multiplexing of the input signals with the function selection signals. The electrically programmable multiple selectable function integrated circuit module 100 is structured as described above for FIG. 1 except the input signals are transferred through the function programming circuit 200 to the input interconnections 220 to the input selector 110.

The external control and timing signals 170 are further combined to form the function selection signal 115. When the external control and timing signals 170 each have a particular and unique state the function selection signal 115 is activated to change the electrically programmable multiple selectable function integrated circuit module 100 from an operational state to a program state. The logic gate 235 logically combines (in this case to perform a logical NAND) the external control and timing signals to form the function selection signal 115. If the active state of one of the external control and timing signals 170 has an active logic level opposite the other external control and timing signals 170, and inverter 237 is placed in the path of the external control and timing signal 170 to negate the signal to insure consistent states. The MOS transistors 240 are activated by the function selection signal 115 through the inverter 230 to effectively disconnect the external control and timing signals 170 for the control and timing function 175, when the electrically programmable multiple selectable function integrated circuit module 100 is in-the program state. The function selection signal 115 is now a mode selection signal to convert the electrically programmable multiple selectable function integrated circuit module 100 between the operational state and the program state.

In the program state, the input signals now contain the configuration data of the function select signals. The input signals are transferred through the input connectors 105 to the function programming circuit 200 to the function select interconnections 225 to the input function selector 110, the first and second internal function selectors 125 and 135, and the output function selector 145 to choose which functions are to manipulate the input data signals.

The function program circuit has a number of latch circuits to act as memory elements to retain the configuration data of the function selection signals. The function program circuit further has a number of MOS transistors 210 and 215 configured as pass devices that will act as the switch to change the state of the electrically programmable multiple selectable function integrated circuit module 100 between the operational state and the program state.

The input connectors are each attached to one of the source terminals of each of the MOS transistors 210 and 215. The drain terminals of each of the MOS transistors 215 are connected to one of the input interconnections 220 and the drain terminal of each of the MOS transistors 210 are connected to one of the function select interconnections 225. The gate terminals of the MOS transistors 210 are connected together and to the function select signal 115. The function select signal 115 acts as the control terminal of the switch. The gate terminals of the MOS transistors 215 are connected together and to the output terminal of the inverter 230. The input of the inverter 230 is connected to the function select signal 115.

When the mode signal 115 is set to put electrically programmable multiple selectable function integrated circuit module 100 in the operational state (0), the MOS transistors 210 are not conducting or on, thus disconnecting the input connectors 105 from the function select interconnections 225. While the MOS transistors 210 are conducting or on, thus connecting the input connectors 105 to the input interconnections 220. Conversely, when the mode signal 115 is set to put the electrically programmable multiple selectable function integrated circuit module 100 in the program state (1), the MOS transistors 215 are not conducting or on, thus disconnecting the input connectors 105 from the input interconnections 220. The MOS transistors 210 are conducting or on, thus connecting the input connectors 105 to the function select interconnections 225.

Figure 3:
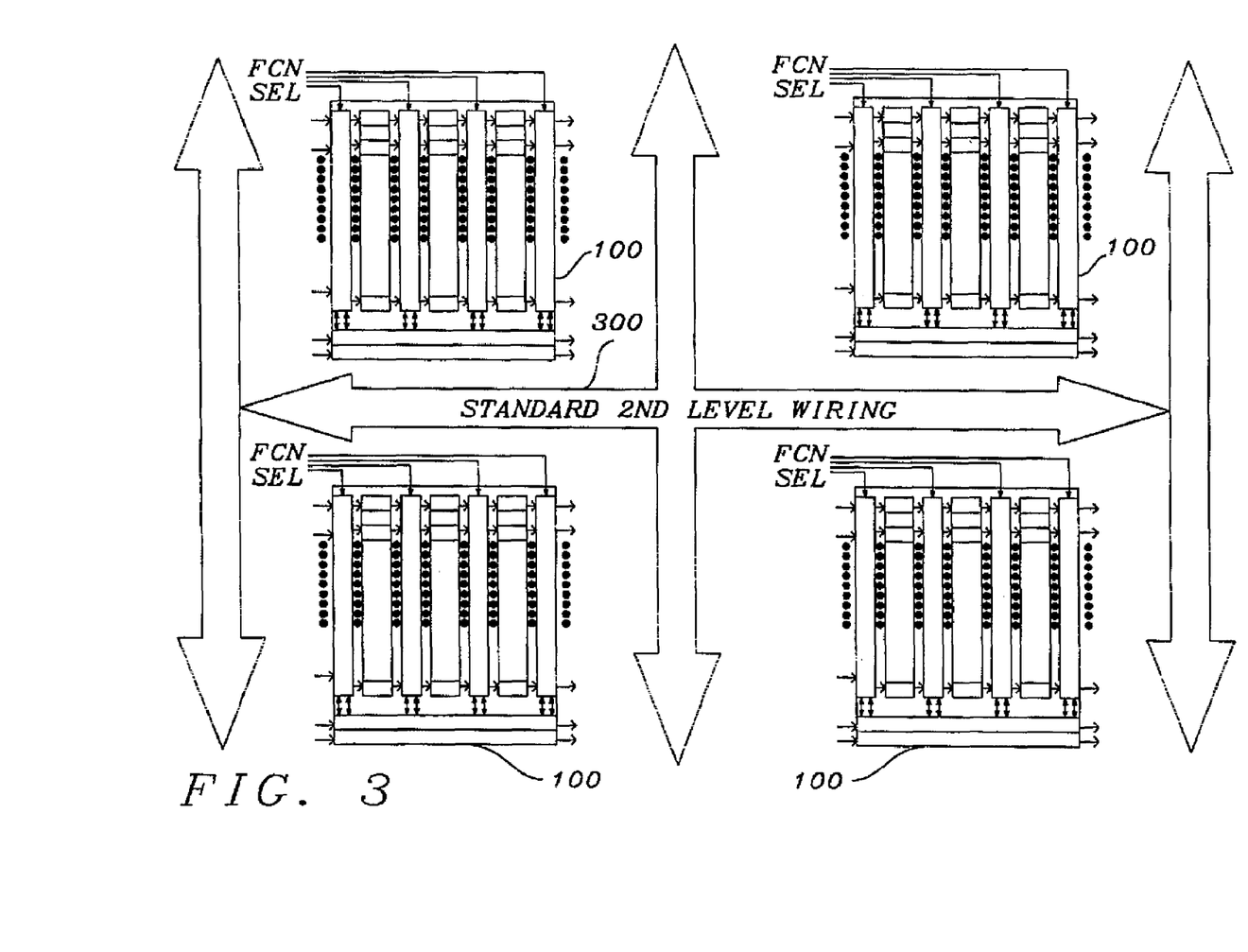
FIG. 3 is a schematic diagram of a system configured with multiple electrically programmable multiple selectable function integrated circuit of this invention.

Having a number of the electrically programmable multiple selectable function integrated circuit modules 100, as shown in FIG. 3, on a second level package (a multi-chip module, or a printed circuit card) allows the interconnection wiring 300 to be standardized for several system functions. The configuration connectors are connected to a controller that will generate the function select signals necessary to configure each of the electrically programmable multiple selectable function integrated circuit modules 100.

An alternative to the structure as shown in FIG. 3 is to incorporate the function of FIG. 2. Certain of the external control signals are activated in a particular pattern to create the function selection signals to allow the input signals to select an alternate function in a program state. The external control and timing signals resume their standard timing and state relationship and the function select signals set the electrically programmable multiple selectable function integrated circuit module 100 to assume the operational state.

Figure 4:
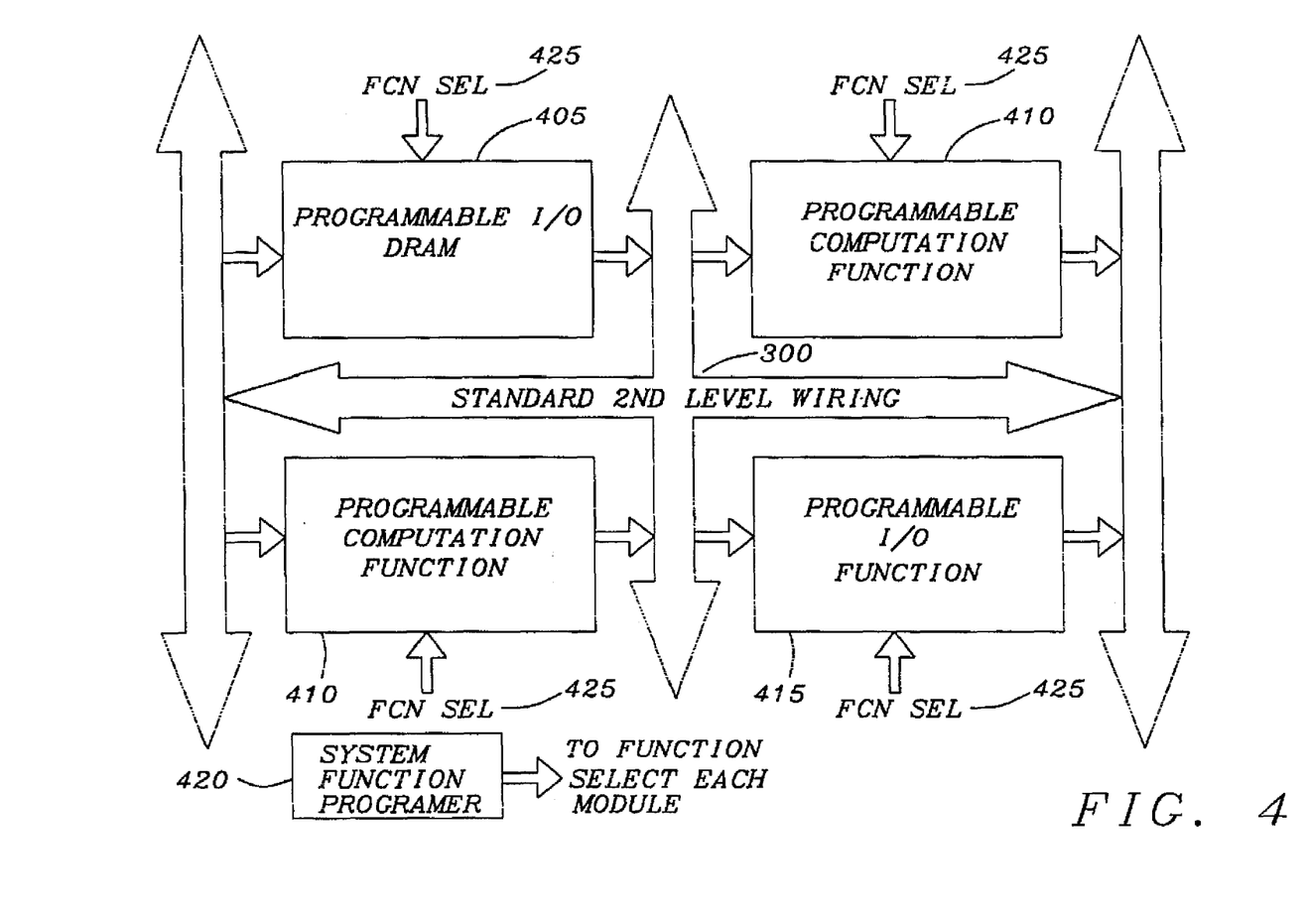
FIG. 4 is a schematic diagram of an embodiment of a system incorporating multiple electrically programmable multiple selectable function integrated circuits of this invention.

FIG. 4 illustrates an example of a number of the electrically programmable multiple selectable function integrated circuit modules 100 on a second level package. The second level package has a programmable I/O DRAM 405. The programmable I/O DRAM 405 is structured such that the number of data bits able to be stored or retrieved from can be adjusted as desired. The second level package has programmable computational functions 410 that can implement complex arithmetic and logical functions such as Fast Fourier Transforms or complicated data base searches and sorts. Finally, the second level package has a programmable I/O function integrated circuit 415. The functions could be a variety of industry standard communication protocols, a digital-to-analog converter, or analog-to-digital converters. These functions allow the same second level package to implement independent complex functions.

The system function programmer 420 creates an appropriate set of control signals on the function select lines 425 to define the functions to be activated on the programmable I/O DRAM's 405, the programmable computation functions 410, and the programmable I/O function 415. Once the function select lines 425 are activated, the input lines of each of the electrically programmable multiple selectable function integrated circuit module 100, configure the desired function. The function select lines 425 are deactivated and the second level package is now programmed for a new function.

Figure 5A:
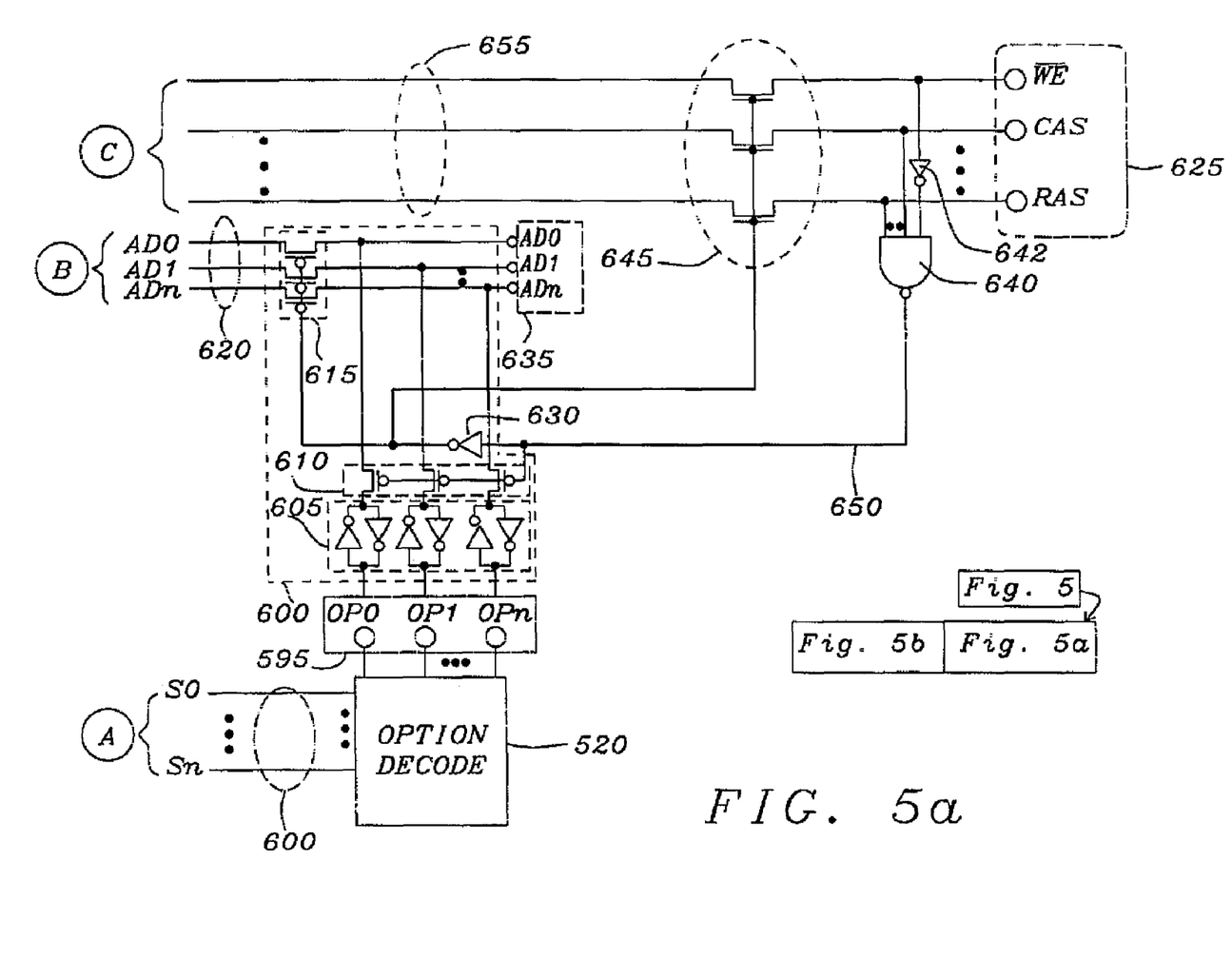
Figure 5B:
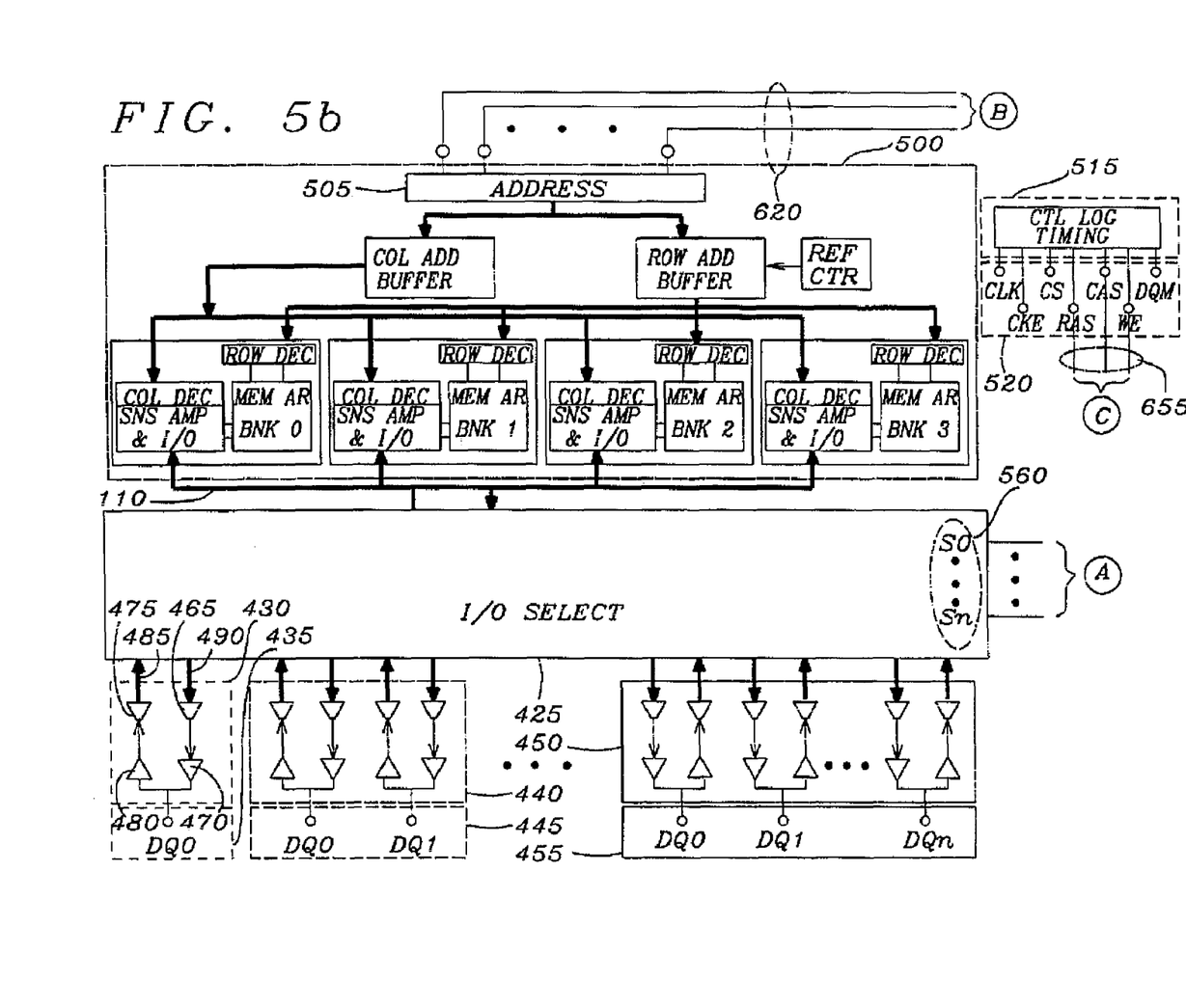

FIG. 5 illustrates a programmable I/O DRAM 405 of FIG. 4. A DRAM array 500 has multiple banks of arrays of DRAM cells. Address signals 620 are applied to the address I/O buffer 505 and decoded within column address and row address decoders to select DRAM cells within the DRAM array 500.

Control and timing signals 520 are applied to the control logic and timing generator 515 to provide the necessary control and timing functions for the DRAM array 500.

Upon applying an address to the DRAM array 500, digital data is transferred to or from the DRAM array 500 by the internal data bus 510. The internal data bus 510 is connected between the sense amplifier and I/O bus on each memory bank. The internal data bus 510 may conceptually have a connection for each column of one memory bank, but usually is the maximum data bit width configuration of the DRAM integrated circuit.

The internal data bus 510 is connected to the input/output pad selector 525. The data bus width of the internal data bus 510 is at least the width of the widest data bit width configuration of input/output data bus 555. Data is received from or transferred to the DRAM module through the data connections 535, 545, and 555. The data connections 535, 545, and 555 are attached to each of the data input/output functions 530, 540, and 550. It should be noted that while each data input/output function 530, 540, and 550 have effective different functions, each data input/output function 530, 540, and 550 may share one or more of the data connections 535, 545, and 555. In this case, the data input/output functions 530, 540, and 550 establish the data bit width configurations and data connections, such as DQ0, are shared by all the data input/output functions.

Each data connection DQ0, DQ1, . . . DQn is connected to the input of a receiver 580 and the output of a driver 570. The output of the receiver 580 is the input of the demultiplexer 575. Each output of the demultiplexer 575 is connected to the input/output selector 525 and through the input/output selector 525 to the internal data bus 510. The demultiplexer 575 collects singularly, a number of data bits equivalent to the number of bits for the internal data bus 510, and transfers them through the input/output selector 525.

The internal data bus 510 is connected to the inputs of the multiplexer 565. The output of the multiplexer 565 is the Input of the driver 570. The output of the driver 570 is connected to one of the data connections DQ0, DQ1, . . . DQn. The multiplexer 565 collects a number of data bits from internal data bus 510 through the input/output selector 425 and serialize these data bits for transfer to the one data connection.

Each of the data input/output functions 530, 540, and 550 is comprised of at least one set of the receivers 580, drivers 570 multiplexers 565, and demultiplexer 575 connected to one of the data connections DQ0, DQ1, . . . DQn. This allows the configurations of the input/output data buses 535, 545, and 555 to be varied as desired. Thus, a single DRAM array design can be configured with any desired bit data width.

The input/output selector 525 selects which of the input/output functions 530, 540, and 550 that are to configured. The select inputs 560 of the input/output selector 525 provide the appropriate logic states to select the desired input/output configuration or which of the input/output functions 530, 540, and 550 are to be implemented. The select inputs 560 are connected to the option decoder 520. The option decoder 520 is connected to the option select connections 595.

The function programming circuit 600 is connected to the option select connections 595 and to the address I/O buffer 505. The address data signals arrive at the address input connectors 635 and are passed to the function programming circuit 600. The mode signal 650 is generated and passed to the function programming circuit 600 by the mode decode circuit 640. The mode decode circuit 640 in this embodiment is a negated logical AND (NAND) of a certain set of the control and timing signals 520. The set of control and timing signals 625 in this embodiment is RAS, CAS, and {overscore (WE)}. When the correct code of the set of the control and timing signals 625 have the appropriate combination of logic states, the mode select line 650 is set from the operational state to the program state. When the mode select line 650 sets the DRAM to the operational state, the address data signals are passed through the address input connectors 635 through the function programming circuit 600 to the address I/O buffer 505 by way of the address input interconnections 620. If the combination of the set of the control and timing signals 625 indicate the mode select line 650 is in the program state, the MOS transistors 645 are turned off to disconnect the set of control and timing signals 625 from the control logic and timing circuit 515. If the active state of any of the control and timing signals 625 is opposite that of the others of the set of the control and timing signals 625, an inverter 642 is placed in the path of that particular control and timing signal to generate the appropriate active level for the mode decode circuit 640.

When the mode select signal 650 indicates the electrically programmable multiple selectable function integrated circuit module 100 is in the program state, the address input connectors 635 receive a configuration signal that is transferred through the function programming circuit 600 to the option select connections 595 and the option decode circuit 520. The option decode circuit 520 will select the desired data input/output functions 530, 540, and 550 to be used at the next store or retrieve operation of the DRAM.

The function program circuit 600 has a number of latching circuits 605 to act as memory elements to retain the configuration signal. The function program circuit 600 further has a number of MOS transistors 610 and 615 configured as pass devices that will act as the switch to change the state of the DRAM between the operational state and the program state.

The address input connectors 635 are each attached to one of the source terminals of each of the MOS transistors 610 and 615. The drain terminals of each of the MOS transistors 615 are connected to one of the address input interconnections 620 and the drain terminals of each of the MOS transistors 610 are connected to one of the inputs of the group of latching circuits 605. The outputs of the group of the latching circuits 605 are connected to one of the option select connections 595. The group of latching circuits 605 receive and retain the configuration signal to allow the address input connectors 635 to resume their operational function. The gate terminals of the MOS transistors 610 are connected together and output of the mode decode circuit 640. The output of the mode decode circuit 640, which is the mode select signal 650, acts as the control terminal of the switch. The gate terminals of the MOS transistors 615 are connected together and to the output terminal of the inverter 630. The input of the inverter 630 is connected to the mode select line 650.

When the mode signal 650 is set to put the DRAM in the operational state (0), the MOS transistors 610 are not conducting or on, thus disconnecting the address input connectors 635 from the option select connections 595. The MOS transistors 615 are conducting or on, thus connecting the address input connectors 635 to the address input interconnections 620. Conversely, when the mode signal 650 is set to put the DRAM in the program state (1), the MOS transistors 615 are not conducting or on, thus disconnecting the address input connectors 635 from the address input interconnections 620. The MOS transistors 610 are conducting or on, thus connecting the address input connectors 635 to the option select connections 595.

Figure 6:
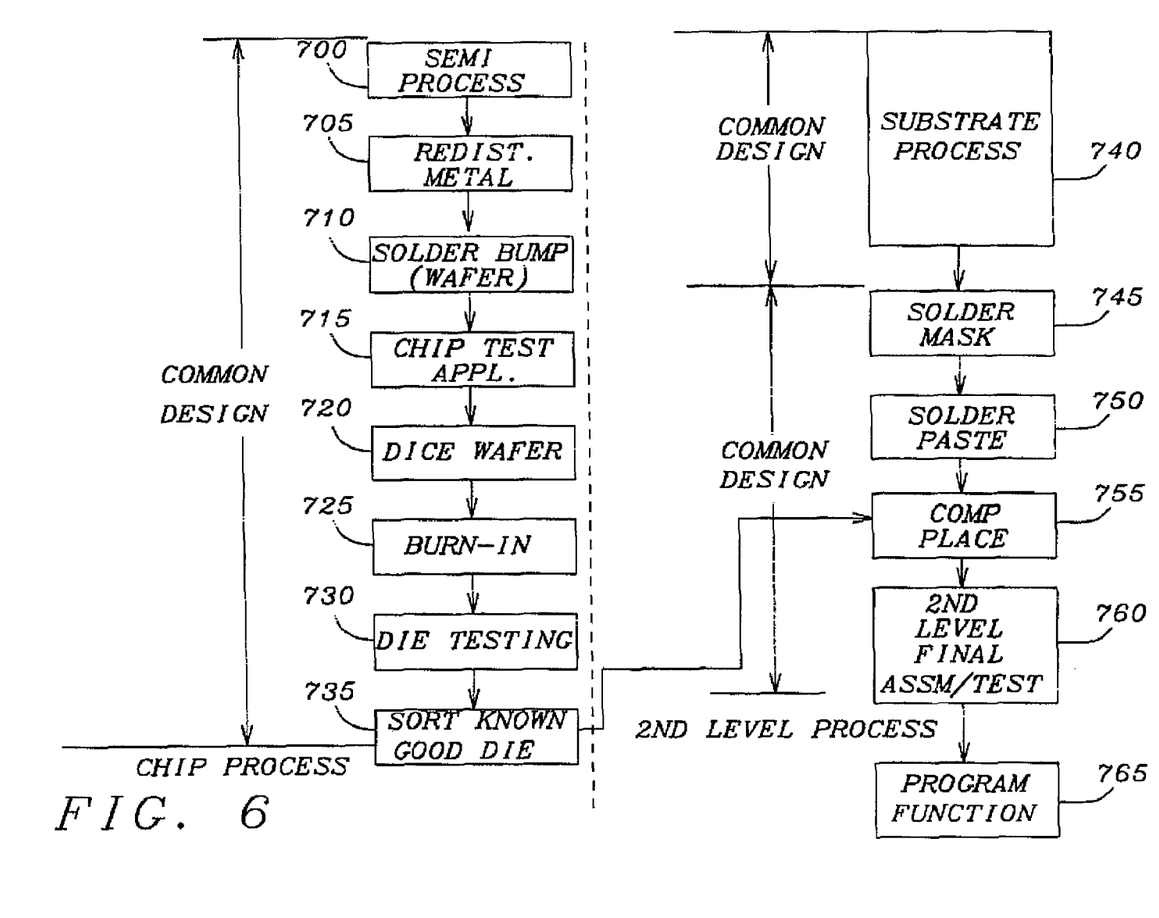
FIG. 6 is a flow chart illustrating the method of this invention for forming an electrically programmable multiple selectable function integrated circuit module of this invention.

For discussion of a method for assembling and selecting desired options of an electrically programmable multiple selectable function integrated circuit module refer to FIG. 6. A multiple selectable function integrated circuit die is formed 700 on a semiconductor wafer by formation and interconnection of electronic circuits on the semiconductor wafer employing known semiconductor processes.

The known good integrated circuit die is formed 700 having multiple optionally selectable function circuits and at least one function configuration circuit. Interconnections are formed between the function configuration circuit and the multiple optionally selectable function circuits so that the function configuration circuit can elect which of the multiple optionally selectable function circuits are to be active. Redistribution metallurgy is formed 705 on the surface of the semiconductor substrate to form input/output pads connected to the multiple optionally selectable function circuits and the function configuration circuit to provide a route for input data signals to arrive a the multiple optionally selectable function circuits, a route for output data signals to be transferred from the multiple optionally selectable function circuits, and a route for configuration signals to be transferred to the function configuration circuit. Further, electronic components are optionally formed 700 on the surface of the semiconductor substrate to create common function circuits connected to the optionally selectable function circuits and the function configuration circuits. Likewise, interconnections are optionally formed 705 to connect the common function circuits to the optionally selectable function circuits and the function configuration circuits.

Redistribution metal is fabricated 705 on the surface of the semiconductor wafer forming the connections of the common internal functions and the selectable internal functions of the multiple selectable function integrated circuit die to input/output pads on the surface of the semiconductor wafer. The solder bumps are then formed and reflowed to form 710 the solder ball on the surface of the semiconductor wafer. The individual multiple selectable function integrated circuit dies are then tested 715 and the functional multiple selectable function integrated circuit dies are identified. The semiconductor wafer is then diced 720 and the functional multiple selectable function integrated circuit die are burned-in 725 to eliminate any early life failures of the functional multiple selectable function integrated circuit dies. The functional multiple selectable function integrated circuit dies are then tested 730 and the known good multiple selectable function integrated circuit die are sorted 735, with the non-functioning die discarded. The forming 700 of the known good multiple selectable function integrated circuit dies allows a single common designed to be inventoried.

The second level package module substrate is formed 740 by applying and forming metal interconnection on substrate laminates of the second level package substrate. The laminates are bonded together to create the second level package substrate. The wiring connections on the second level package substrate may either be custom for each option selection of the multiple selectable function integrated circuit or have a common design to minimize inventory of the different option designs.

A solder mask is placed 745 on the second level package substrate. The solder mask will expose the interconnecting pads of the metal interconnections on the second level package substrate to the electrically programmable multiple selectable function integrated circuit die. Solder paste is applied 750 to make contact with the interconnecting pads of the metal interconnections on the second level package substrate. The known good multiple selectable function integrated circuit die are then secured 755 to the second level package substrate to form the connections between the desired functions of the multiple selectable function integrated circuit die and external circuitry through the metal interconnections on the second level package substrate.

The second level package substrate is processed 755 through final assembly and test and is ready for further system level construction. Since the final assembly is the "gang-bonding" as in what is known in the art as "flip chip assembly" no extra cost is incurred to have the ability to select multiple functions during system and subsystem assembly.

The electrically programmable multiple selectable function integrated circuit module is connected 765 to a function program source. The function program source provides the necessary configuration signals to the electrically programmable multiple selectable function integrated circuit module to select the desired functions.

By having standard data input, data output, and configuration signal paths, a second level package can be a common design for multiple functions. Further, the function programming source allows the function of the second level package to be modified during operation to allow complex functions to be performed without having to have duplicate hardware available. An example is the DRAM of FIG. 5, which could have multiple I/O structures available for different applications of the same DRAM module.

It should be noted that the second level package substrate may be a ceramic substrate, a plastic substrate, a fiberglass reinforced substrate, a metal substrate having layers of insulative material to isolate the metal interconnections, semiconductor substrates, a glass substrate, or an integrated circuit die to form a chip-on-chip structure.

While this invention has been particularly shown and described with reference to the preferred embodiments thereof, it will be understood by those skilled in the art that various changes in form and details may be made without departing from the spirit and scope of the invention.

What is claimed is:

1. An integrated circuit chip having multiple functional options, comprising:
   a control unit controlling said integrated circuit chip operated in an operation mode or in a configuration mode;
   a latch circuit;
   a connection transmitting a first signal when said integrated circuit chip is operated in said operation mode, and transmitting a second signal to select one of said multiple functional options when said integrated circuit chip is operated in said configuration mode, wherein said second signal is latched in said latch circuit when said integrated circuit chip is operated in said configuration mode;
   a semiconductor substrate;
   a redistribution metal over said semiconductor substrate; and
   a solder bump connected to an I/O pad of said redistribution metal.

2. The integrated circuit chip of claim 1, wherein said control unit comprises a first MOS transistor, a second MOS transistor and an inverter, wherein a channel of said first MOS transistor has said first signal pass therethrough and is connected to said connection when said integrated circuit chip is operated in said operation mode, wherein a channel of said second MOS transistor has said second signal pass therethrough and is connected to said connection when said integrated circuit chip is operated in said configuration mode, wherein a first terminal of said inverter is connected to a gate terminal of said first MOS transistor, and a second terminal of said inverter is connected to a gate terminal of said second MOS transistor.

3. The integrated circuit chip of claim 2 further comprising a NAND gate having an output terminal connected to said gate terminal of said second MOS transistor and to said second terminal of said inverter.

4. The integrated circuit chip of claim 3 further comprising a third MOS transistor having a non-gate terminal connected to an input terminal of said NAND gate, and a gate terminal connected to said first terminal of said inverter.

5. The integrated circuit chip of claim 1, wherein said control unit is controlled by a mode select signal to select said integrated circuit chip operated in said operation mode or in said configuration mode.

6. The integrated circuit chip of claim 1 is a DRAM.

7. A memory chip having multiple data-width options, comprising:
   a control unit controlling said memory chip operated in an operation mode or in a configuration mode;
   a latch circuit;
   an address decoder;
   an option decoder;
   a connection transmitting a first signal to said address decoder when said memory chip is operated in said operation mode, and transmitting a second signal to said option decoder to select one of said multiple data-width options when said memory chip is operated in said configuration mode, wherein said second signal is latched in said latch circuit when said memory chip is operated in said configuration mode;
   a semiconductor substrate; and
   a solder bump over said semiconductor substrate.

8. The memory chip of claim 7, wherein said control unit comprises a first MOS transistor, a second MOS transistor and a first inverter, wherein a channel of said first MOS transistor has said first signal pass therethrough and connects said connection to said address decoder when said memory chip is operated in said operation mode, wherein a channel of said second MOS transistor has said second signal pass therethrough and connects said connection to said option decoder when said memory chip is operated in said configuration mode, wherein a first terminal of said first inverter is connected to a gate terminal of said first MOS transistor, and a second terminal of said first inverter is connected to a gate terminal of said second MOS transistor.

9. The memory chip of claim 8 further comprising a NAND gate having an output terminal connected to said gate terminal of said second MOS transistor and to said second terminal of said first inverter.

10. The memory chip of claim 9, wherein said NAND gate has an input terminal receiving a CAS signal.

11. The memory chip of claim 9, wherein said NAND gate has an input terminal receiving a RAS signal.

12. The memory chip of claim 9 further comprising a second inverter having an output terminal connected to an input terminal of said NAND gate, and an input terminal receiving a $\overline{WE}$ signal.

13. The memory chip of claim 9 further comprising a third MOS transistor having a non-gate terminal connected to an input terminal of said NAND gate, and a gate terminal connected to said first terminal of said first inverter.

14. The memory chip of claim 7, wherein said control unit is controlled by a mode select signal to select said memory chip operated in said operation mode or in said configuration mode.

15. The memory chip of claim 7 is a DRAM.

16. An integrated circuit chip having multiple functional options, comprising:
a control unit controlling said integrated circuit chip operated in an operation mode or in a configuration mode;
a latch circuit;
a connection transmitting a first signal when said integrated circuit chip is operated in said operation mode, and transmitting a second signal to select one of said multiple functional options when said integrated circuit chip is operated in said configuration mode, wherein said second signal is latched in said latch circuit when said integrated circuit chip is operated in said configuration mode;
a semiconductor substrate; and
a solder bump over said semiconductor substrate.

17. The integrated circuit chip of claim 16, wherein said control unit comprises a first MOS transistor, a second MOS transistor and an inverter, wherein a channel of said first MOS transistor has said first signal pass therethrough and is connected to said connection when said integrated circuit chip is operated in said operation mode, wherein a channel of said second MOS transistor has said second signal pass therethrough and is connected to said connection when said integrated circuit chip is operated in said configuration mode, wherein a first terminal of said inverter is connected to a gate terminal of said first MOS transistor, and a second terminal of said inverter is connected to a gate terminal of said second MOS transistor.

18. The integrated circuit chip of claim 17 further comprising a NAND gate having an output terminal connected to said gate terminal of said second MOS transistor and to said second terminal of said inverter.

19. The integrated circuit chip of claim 18 further comprising a third MOS transistor having a non-gate terminal connected to an input terminal of said NAND gate, and a gate terminal connected to said first terminal of said inverter.

20. The integrated circuit chip of claim 16, wherein said control unit is controlled by a mode select signal to select said integrated circuit chip operated in said operation mode or in said configuration mode.

\* \* \* \* \*